United States Patent [19]

Singh et al.

[11] Patent Number: 4,542,321
[45] Date of Patent: Sep. 17, 1985

[54] INVERTED MAGNETRON ION SOURCE

[75] Inventors: Bawa Singh; David Boyarsky, both of Cherry Hill, N.J.

[73] Assignee: Denton Vacuum Inc, Cherry Hill, N.J.

[21] Appl. No.: 397,527

[22] Filed: Jul. 12, 1982

[51] Int. Cl.³ .............................................. H01J 7/24
[52] U.S. Cl. ................................. 315/111.81; 250/427; 250/423 R; 315/111.91
[58] Field of Search ............... 250/423, 426, 427, 424; 315/111.91, 111.81

[56] References Cited

U.S. PATENT DOCUMENTS 2,131,897 10/1938 Malter ........................... 315/111.91
3,156,842 11/1964 McClure ........................ 315/111.91
3,292,844 12/1966 McKenzie ...................... 315/111.91
4,139,772 2/1979 Williams .............................. 250/427

FOREIGN PATENT DOCUMENTS 849565 9/1960 United Kingdom ........... 315/111.91

Primary Examiner—Harold Dixon
Attorney, Agent, or Firm—William E. Cleaver

[57] ABSTRACT

The present invention provides, in a preferred embodiment, a cylindrical stainless steel cathode with end pieces thereon to form a cathode chamber within. In addition, in a preferred embodiment, there is a stainless steel rod which passes axially through the cathode chamber and which is electrically insulated therefrom at the end pieces. The stainless steel cathode has first and second apertures formed therein with the first to be connected to a source of ionizable gas and the second to act as the opening through which there passes a stream of ions to an ion beam target. A magnetic flux source is coupled to the cathode chamber to pass magnetic flux therethrough and a voltage source is connected between the anode and the cathode to provide an electrostatic field therebetween whereby when ionizable gas is fed into the cathode chamber, it is ionized and a stream of ions emanates from the second aperture. In a preferred embodiment there is further provided an electrostatic ion focusing means to focus the ion stream emanating from the second aperture.

4 Claims, 5 Drawing Figures

INVERTED MAGNETRON ION SOURCE

BACKGROUND

Ion beams, or streams of ions, are used and have been used: to etch materials; to clean substrates for subsequent laying down (coating) of materials thereon; to effect sputtering to provide the material to be laid down; to alter the properties of films as deposited by other sources; and to effect chemical reactions between certain gases and the material bombarded by the ion stream. All of these many practices have required an ion beam source or a source of a stream of ions. In the prior art, ion beam guns have been of varied designs. One popular design has been to employ a cylindrical stainless steel anode which has cathode end pieces. The cathode and anode are, of course, electrically insulated from one another and when electrical power is applied to the cathode and anode there is an electrostatic field created therebetween. Ionizable gas is fed to the cylinder and reacts to provide a glow discharge and a source of ions.

In the prior art ion beam guns, magnetic flux is generated by locating a winding around the circumference of the cylinder and passing an electrical current therethrough. The magnetic flux thus generated passes through the stainless steel cylinder and acts in conjunction with the electrostatic field to cause ions to move along a substantially helical path toward the cathode, i.e., end pieces and through an aperture in the end pieces. A major problem with such prior art ion beam guns lies in the fact that they have been physically large to accommodate the windings for the electromagnetic sources of flux, i.e., solenoid type devices. Very often such prior art devices have employed high temperature filaments within the plasma chamber to be heated up and provide electrons which in turn move about in the chamber to have collisions and free up ions thereby increasing the density of the plasma. However, such filaments necessitate a relatively large device with added power sources and necessitate regular maintenance to replace burned out filaments. In addition, the high temperature filament ion guns generate unwanted heat. In addition, the configuration and densities of the electrostatic fields and the magnetic flux fields of the prior art ion beam guns have not enhanced the plasma density to provide high output ion currents at relatively low source chamber pressures. The present invention employs an inverted magnetron arrangement with the cathode being coaxial with the anode, with the magnetic flux being coaxial with the cathode and anode, with the exit aperture being intermediate with the ends of the chamber, and with an electrostatic focusing device at the exit aperture, all of which permits a physically smaller ion gun to be assembled and which permits a greater output of ions, i.e., a greater ion current at lower chamber pressure.

SUMMARY

The present invention is an ion beam source which employs a closed end cylindrical stainless steel chamber as a cathode. While the description calls for stainless steel as a cathode and an anode, it should be understood that other non-magnetic materials could be used such as carbon, copper, aluminum and the like. An electrical current conducting rod is disposed to pass axially through the cylinder and when electrical power is applied to the anode and cathode an electrostatic field is created therebetween, which field is orthogonal to the axis of the cathode and anode. The magnetic flux within the cylinder is provided by two permanent magnets, which are mounted on the ends of the cylinder and which have opposite types of pole faces facing one another along the axis of the cylinder, so that the magnetic flux running, for instance, from a north pole to a south pole, will be coaxial with the axis of the anode and cathode. When ionizable gas is introduced into the chamber at a suitable pressure, a glow discharge is created, which results in having positive ions move to bombard the cathode. The bombardment of the cathode in turn dislodges electrons which travel on azimuthal and axial courses along the cathode chamber. Thus, by collisions between the electrons and gas molecules, ions are freed which move toward the cathode. An input aperture and an output aperture are formed in the cathode wall. The input aperture enables the ionizable gas to be placed in the chamber and the output aperture enables at least part of the ions, which are moving toward the cathode, to pass through the output aperture in ion beam form, toward an ion beam target. Mounted in close proximity to the output aperture is an electrostatic focusing device which focuses the ion beam.

The objects and features of the present invention will be better understood in view of the following description taken in conjunction with the drawings wherein:

FIG. 1 a side view, partially in section, schematic layout of the elements making up the present ion beam gun; and FIG. 2 is an end view of the structure depicted in FIG. 1;

Figure 1:
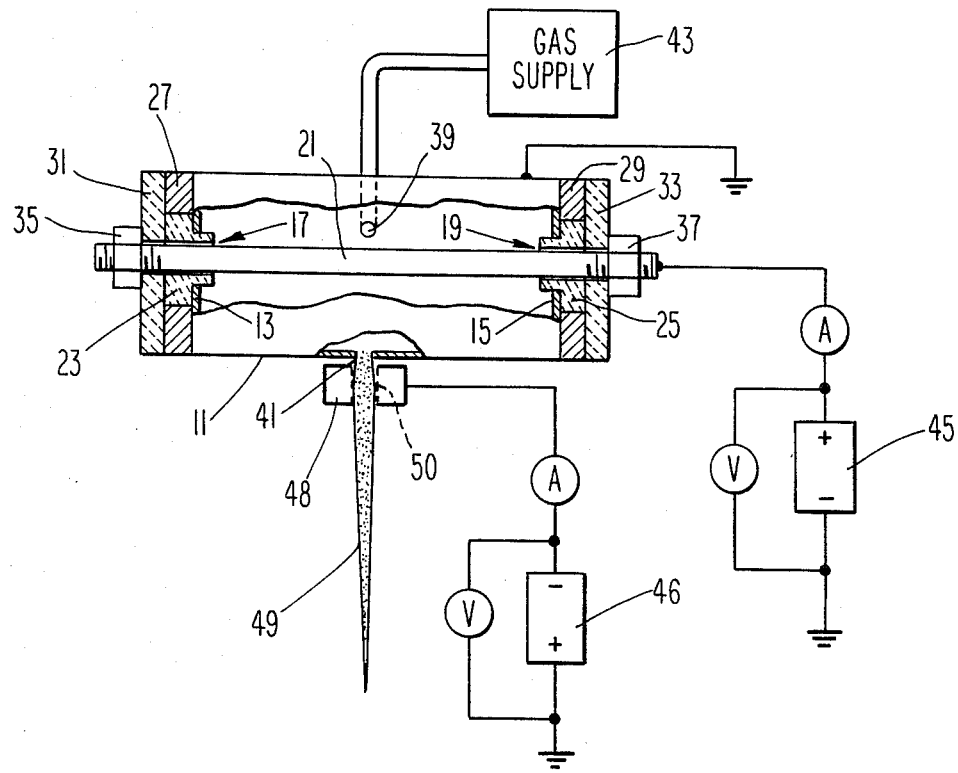

In FIG. 1, there is shown a cathode device 11, which in the preferred embodiment is a stainless steel cylinder. Cylinders made of other materials such as aluminum or copper, could be used. The cylinder 11 has two end pieces 13 and 15, which are disc shaped with a hole in the center and which are formed integral with the cylinder 11. There are two apertures 17 and 19 respectively formed in the end pieces 13 and 15. An anode 21, which in the preferred embodiment is made of stainless steel, is located to pass through the apertures 17 and 19. It should be understood that the anode 21 need be an electrical current conducting material, which is non-magnetic and which is not susceptible to changes because of high temperatures. Anode 21 could be fabricated from other suitable material such as copper, tungsten, molybdenum, tantalum, carbon, and the like. Located in the apertures 17 and 19 are two ceramic insulating bushings 23 and 25, which act to electrically insulate the cathode 11 from the anode 21 and which further act to couple the anode to the cathode in relatively secure fashion.

As can be seen in FIG. 1, surrounding the flanges of the bushings 23 and 25 are respectively two permanent magnets 27 and 29. The magnets 27 and 29, in a preferred embodiment are disc shaped and are made from cobalt-samarium and have pole-face magnetic field strengths of approximately 2000 gauss. Other suitable magnets may be used. The magnets 27 and 29 are arranged, or disposed, on the ends of the cathode cylinder 11 such that a north pole of magnet 29 is flush against the end piece 15 to face a south pole of magnet 27 which is disposed in abutment with the end piece 13. The arrangement as to north pole - south pole could be vice versa. The purpose of the arrangement of the magnets 27 and 29 is to have lines of magnetic flux, passing through the cathode cylinder 11, in a coaxial configuration with respect to the axis of the cathode 11 and the anode 21.

To secure the bushings 23 and 25, and the magnets 27 and 29, to the cathode cylinder 11, there are provided two insulating ceramic spacers 31 and 33, which are disposed in tight abutment with the bushings and magnets and held in that tight arrangement by the threaded blocks 35 and 37. Other forms of fastening means could be employed.

It should be noted in FIG. 1 that the cathode cylinder has an inlet aperture 39 formed therein and an outlet aperture 41 formed therein. Ionizable gas such as argon, nitrogen, neon oxygen or the like from a gas supply 43 is admitted into the cathode cylinder 11. As can be seen in FIG. 1, a source of d.c. (direct current) electrical power 45 is connected to the anode 21 and the cathode 11. The electric power thus connected creates an electrostatic field between the cathode and anode. The gas from the gas source 43 in the presence of the electrostatic field creates a glow discharge. Prior to the creation of the glow discharge, there are already some free ions and electrons in the cathode chamber due to thermal ionization and those ions move to impinge on the cathode 11 and in response to such impingement, electrons are dislodged to join the allready available electrons. The electrons are accelerated toward the anode 21. The movement of the electrons is the result of a number of forces. The emitted electrons are "tied" to magnetic field lines and gyrate around them in a helical path. In addition, throughout the cylindrical cathode chamber, the electrostatic and magnetic flux fields are mutually perpendicular and thus the electrons are subjected to the Lorentz force, which causes the electrons to move in an azimuthal and axial direction. Further, the electrons "jump" from one magnetic field line to the next, toward the anode. As a result of all of the foregoing movements, the electrons are trapped for a relatively long time in the discharge volume but always moving, always colliding with neutral gas atoms to free up ions. As a result, an ion avalanche takes place.

It should be noted that at the electrodes there are formed regions (of charged particles) called sheaths. Within the plasma, the electrostatic field is relatively small. The electrons are accelerated across the sheath from the cathode surface and are subjected to the forces described above before they reach the anode. The positive ions which travel toward the cathode are also subject to the above forces but because of their much greater mass and slower speed, they move toward the cathode in slightly curved paths.

The positive ions which are moved toward the cathode are so moved toward substantially the entire inside surface of the cylinder. By forming an output aperture in the wall of the cathode cylinder, the ions which are moving toward the cathode, whereat the output aperture lies, will pass through the wall to provide an ion beam or stream of ions. The ions leaving the output aperture are characterized by the inertia of being on a slightly curved path and are travelling, as a group, somewhat omnidirectional because their paths inside the cylinder are different, thus they are dispatched to pass through the output aperture from different locations. The present system provides an electrostatic focusing means (a lens device) mounted outside of the output aperture which focusing means provides an electrostatic field through which the ion beam passes and depending on the intensity and direction of the electrostatic field, the ion beam can be narrowed or widened.

In the preferred embodiment, the lens 48 is a disc with an aperture therethrough, defined by the dashed lines 50. A d.c. power supply 46 is connected to the lens to provide a difference of potential between the lens and the cathode, whereby the ions are attracted to the negative potential of the lens. The electrostatic field between the lens and the cathode shapes the ion beam, as shown, but it should be understood that the ion beam can be shaped otherwise depending upon the power applied.

Figure 2:
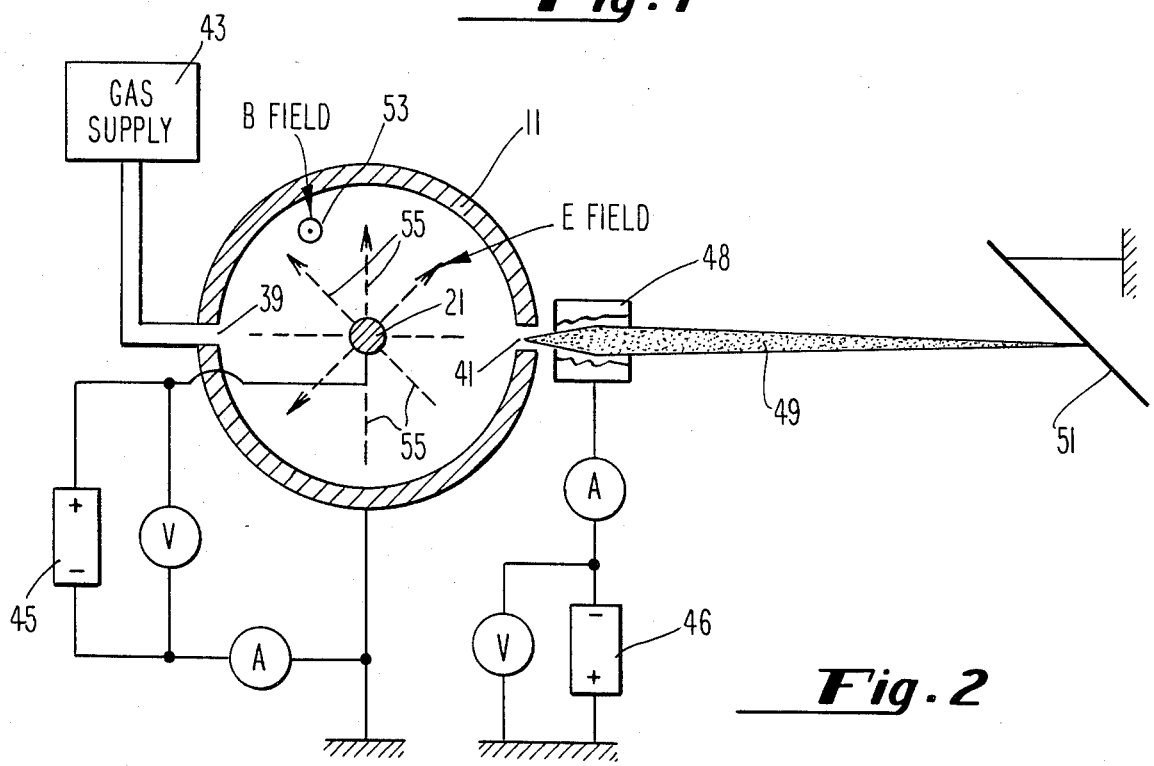

FIG. 2 shows an end view of the structure of FIG. 1. In FIG. 2, there is shown the cathode 11, the anode 21, the gas supply source 43, the d.c. power supply 45 for the cathode-anode difference of potential, a d.c. power supply 46 for the focusing means 48, the gas input aperture 39, the ion beam output aperture 41, the ion beam 49 and the target 51. In addition, the direction of the B field or magnetic flux lines is depicted by the dot-circle 53, which indicates that the flux lines are coaxial with the anode and come out of the drawing. It should be understood that the flux lines could go into the drawing by changing the relationship of the magnetic poles of the magnets 27 and 29 in FIG. 1. The electrostatic field (B field) is also shown in FIG. 2 by the arrows 55.

Figure 3:
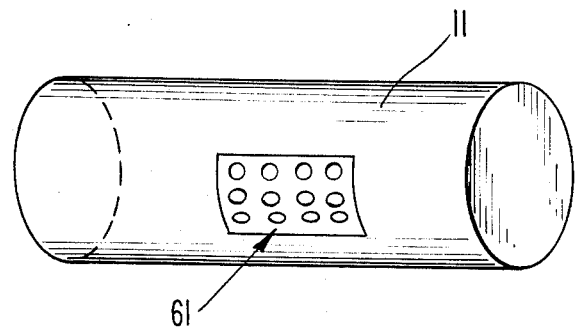
FIG. 3 is a side view depicting a plurality of apertures to provide a plurality of ion beams.

FIG. 3 depicts the cathode 11 with a plurality of apertures 61 formed in the sidewall thereof. The sidewall can be flattened, as shown, which enables the use of a multiposition focusing means to be more readily arranged, but it should be understood that the wall could remain concave with the plurality of apertures formed therein. The multiposition focusing means is a grid type of structure, with a d.c. power source connected thereto, which provides an electrostatic field between the focusing means and the cathode, and which accepts the plurality of ion beams coming through the plurality of apertures to be focused. By suitably configuring the focusing means, the many ion beams can be focused into a single beam or into a number of beams less than the original number of apertures. It should be recalled that the ions move toward the cathode throughout the cathode chamber and hence, are available to form ion beams at many locations.

Figure 4:
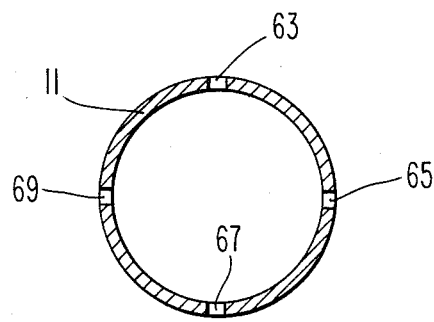
FIG. 4 is a sectional end view through a plurality of apertures.

FIG. 4 depicts the cathode 11, as viewed from the end (and without the anode) and as being cut through a plurality of exit apertures 63, 65, 67 and 69. Each of the exit apertures 63, 65, 67 and 69 is formed to direct ion beams 90 degrees apart. It should be understood that the apertures could be formed to direct ion beams at other angles. Since the ions are directed to the cathode 11 along its inside wall, in all directions, the apertures 63, 65, 67 and 69 can be so formed to provide four widely separated ion beams. In such a configuration, focusing means and power supplies and anode, etc. would be employed to generate the ion plasma and ion beams as described with the structure shown in FIGS. 1 and 2.

Figure 5:
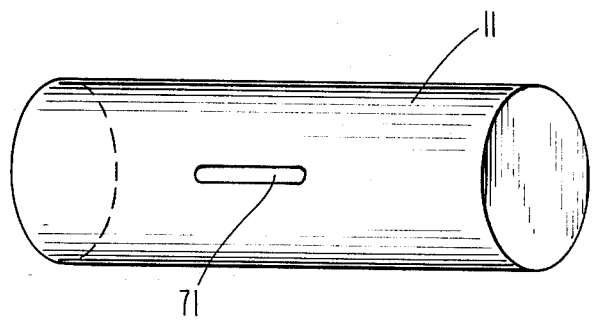
FIG. 5 is a side view depicting a slit form of aperture.

FIG. 5 shows the cathode 11 with an aperture 71 formed to be a slit. The slit aperture 71 in the wall of cathode 11 enables a wide stream of ions to emanate therefrom, headed toward the focusing means, not shown, and this wide ion beam, when focused, provides a high ion current to the target.

It is well understood in the prior art, that if the ion gun has the discharge chamber subjected to high pressure ionizable gases, these gases, when ionized, provide more free ions, hence, a higher ion current or a more dense ion beam than a condition where the ionizable gases are not at a high pressure. The price that is paid to obtain the high ion current is threefold. First, the more gas admitted, the higher become the possibilities of contamination of the end product, i.e., the material which is the coating or which is laid down on a substrate. Secondly and thirdly, the amount of neutral gas leaving the plasma chamber and entering the vacuum chamber is high and this relatively large amount of neutral gas operates to scatter the ion beam which interference is highly undesirable and such a relatively large amount of neutral gas scatters the material which is dislodged from the target and that interference is also highly undesirable. Accordingly, it is apparent that it would be desirable to operate an ion beam gun at relatively low pressure. The present system can generate relatively high ion current at relatively low chamber pressure because of the long life time of the electrons in the discharge chamber. The long life time is caused in great measure by the orthogonal arrangement of the magnetic field with respect to the electrostatic field and because of the large magnetic field created.

We claim:

1. An ion source comprising in combination: A hollow cathode chamber formed by having a substantially cylindrical wall and end pieces fitted at the ends of said cylindrical wall and said hollow cathode chamber further formed to hold ionizable gas; at least first and second apertures formed in said substantially cylindrical wall; anode means formed and disposed to extend substantially axially through said cathode chamber and extending from at least one of said end pieces; insulation means formed and disposed to electrically insulate said cathode means from said anode means; magnetic flux generating means formed and disposed to generate lines of magnetic flux which pass, from one of said end pieces to the other end piece, through said cathode chamber and substantially coaxially with said anode means; voltage source means connected to said cathode means and said anode means to produce an electrostatic field therebetween within said cathode chamber; ionizable gas source means coupled to said first aperture to provide ionizable gas to said cathode chamber whereby said gas will be ionized and ions will be accelerated toward said cathode chamber wall thereby causing some of said ions to pass in a stream through said second aperture; and ion beam focusing means disposed in close proximity to said second aperture to focus to a point an ion stream emanating therefrom to produce greater ion current at a lower chamber pressure.

2. An ion source according to claim 1 wherein said ion beam focusing means includes a hollowed out structure and a voltage source connected thereto whereby there is a difference in voltage created between said cathode chamber and said beam focusing means.

3. An ion source according to claim 1 wherein said cathode means is formed to have a plurality of apertures, substantially grouped, in one section of its cylindrical wall to provide a plurality of ion beams emanating therefrom.

4. An ion source according to claim 1 wherein said cathode means is formed to have a plurality of apertures formed around its cylindrical wall to provide a plurality of ion beams directed in substantially different directions.

* * * * *